US010846158B2

(12) United States Patent
Rajgopal et al.

(10) Patent No.: US 10,846,158 B2
(45) Date of Patent: Nov. 24, 2020

(54) APPARATUS HAVING MULTIPLEXERS FOR PASSIVE INPUT/OUTPUT EXPANSION AND METHODS OF THEIR OPERATION

(71) Applicant: MICRON TECHNOLOGY, INC., Boise, ID (US)

(72) Inventors: Suresh Rajgopal, San Deigo, CA (US); Dan E. Soto, Boise, ID (US); Steven Eskildsen, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 116 days.

(21) Appl. No.: 16/153,955

(22) Filed: Oct. 8, 2018

(65) Prior Publication Data
US 2020/0110645 A1    Apr. 9, 2020

(51) Int. Cl.
G06F 11/00 (2006.01)
G06F 11/07 (2006.01)
G06F 12/02 (2006.01)
G06F 13/10 (2006.01)

(52) U.S. Cl.
CPC ........ G06F 11/073 (2013.01); G06F 12/0246 (2013.01); G06F 13/102 (2013.01)

(58) Field of Classification Search
None
See application file for complete search history.

(56) References Cited

U.S. PATENT DOCUMENTS

| 6,546,510 | B1 * | 4/2003 | Mazumder | G11C 29/38 365/201 |
| 6,751,159 | B2 * | 6/2004 | Farrell | G11C 11/4087 365/185.12 |
| 7,577,789 | B2 * | 8/2009 | Perego | G06F 13/409 711/115 |
| 8,327,224 | B2 | 12/2012 | Larsen et al. | |
| 8,364,926 | B2 * | 1/2013 | Hampel | G06F 13/1684 711/168 |

(Continued)

OTHER PUBLICATIONS

Ashok K. Sharma, "Random Access Memory Technologies," in Semiconductor Memories: Technology, Testing, and Reliability, IEEE, 1997, pp. 10-80, doi: 10.1109/9780470546406.ch2. (Year: 1997).*

(Continued)

Primary Examiner — Daniel F. McMahon
(74) Attorney, Agent, or Firm — Dicke, Billig & Czaja, PLLC

(57) ABSTRACT

Apparatus having first and second sets of memory devices commonly connected to receive a first enable signal and a second enable signal, respectively, and a multiplexer connected to receive the first and second enable signals. The multiplexer is configured to connect the first set of memory devices to an output of the apparatus in response to the first enable signal having a first logic level, and to isolate the first set of memory devices from the output in response to the first enable signal having a second logic level different than the first logic level. The multiplexer is further configured to connect the second set of memory devices to the output in response to the second enable signal having the first logic level, and to isolate the second set of memory devices from the output in response to the second enable signal having the second logic level.

22 Claims, 10 Drawing Sheets

(56) References Cited

U.S. PATENT DOCUMENTS

| | | | |
|---|---|---|---|
| 9,417,685 B2 | 8/2016 | Ha et al. | |
| 2005/0213399 A1* | 9/2005 | Hoover | G06F 13/4243 |
| | | | 365/191 |
| 2009/0039927 A1* | 2/2009 | Gillingham | G11C 16/28 |
| | | | 327/156 |
| 2018/0113821 A1* | 4/2018 | Narasimhan | G06F 13/1689 |
| 2019/0244645 A1* | 8/2019 | Penney | G11C 29/022 |

OTHER PUBLICATIONS

"1.4 High-Speed / Low-Speed Multiplexer Pair," MX0141VA0 Short-Form Datasheet, Integrated Device Technology, Inc., San Jose, CA, May 1, 2017, pp. 6.

Kim, Hyun-Jin, "1GB/s 2Tb NAND Flash Multi-Chip Package with Frequency-Boosting Interface Chip," 2015 IEEE International Solid-State Circuits Conference, 2015, pp. 3.

\* cited by examiner

APPARATUS HAVING MULTIPLEXERS FOR PASSIVE INPUT/OUTPUT EXPANSION AND METHODS OF THEIR OPERATION

TECHNICAL FIELD

The present disclosure relates generally to memory and, in particular, in one or more embodiments, the present disclosure relates to apparatus and methods of their operation incorporating passive input/output (I/O) expansion.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

There is generally a continuing desire to increase memory density, e.g., the number of bits of data that can be stored for a given integrated circuit die area. One method of achieving increased memory density is to incorporate stacks of memory dies, e.g., providing multiple memory devices (logical units or LUNs) enabled by a single chip enable control signal, and distinguishing between individual memory devices through addressing. However, as higher numbers of memory dies are incorporated into a multi-die package, loading on the data bus accessing these memory dies, in the form of capacitance, may generally increase. Such increased capacitance can tend to limit overall performance of the bus.

This increase in capacitance can be exacerbated in bulk storage devices such as solid state drives (SSDs). Instead of storing data on rotating media, such as used in traditional hard disk drives (HDDs), SSDs typically utilize semiconductor memory devices to store their data, but often include an interface and form factor making them appear to their host device as if they are a typical HDD. To increase the capacity of the SSD, its memory devices are often arranged in a number of channels, with each channel being in communication with a number of memory devices, often configured as multi-die packages. As the number of multi-die packages per channel increases, their effect on capacitance can be additive, which can detrimentally impact the overall performance of the SSD.

Expander blocks have been used to expand the number of memory devices feasible on a communication channel of a bulk storage device, and are described in U.S. Pat. No. 8,327,224 B2 to Larsen et al. Expander blocks of this type selectively connect the communication channel, including a set of chip enable signal lines, to one of a number of groups of memory devices, where the connected group of memory devices shares a data bus. However, such use of expander blocks can result in connecting enabled and disabled memory devices to the communication channel concurrently. In addition, such expander blocks can require relatively high power requirements.

DETAILED DESCRIPTION

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

Figure 1:
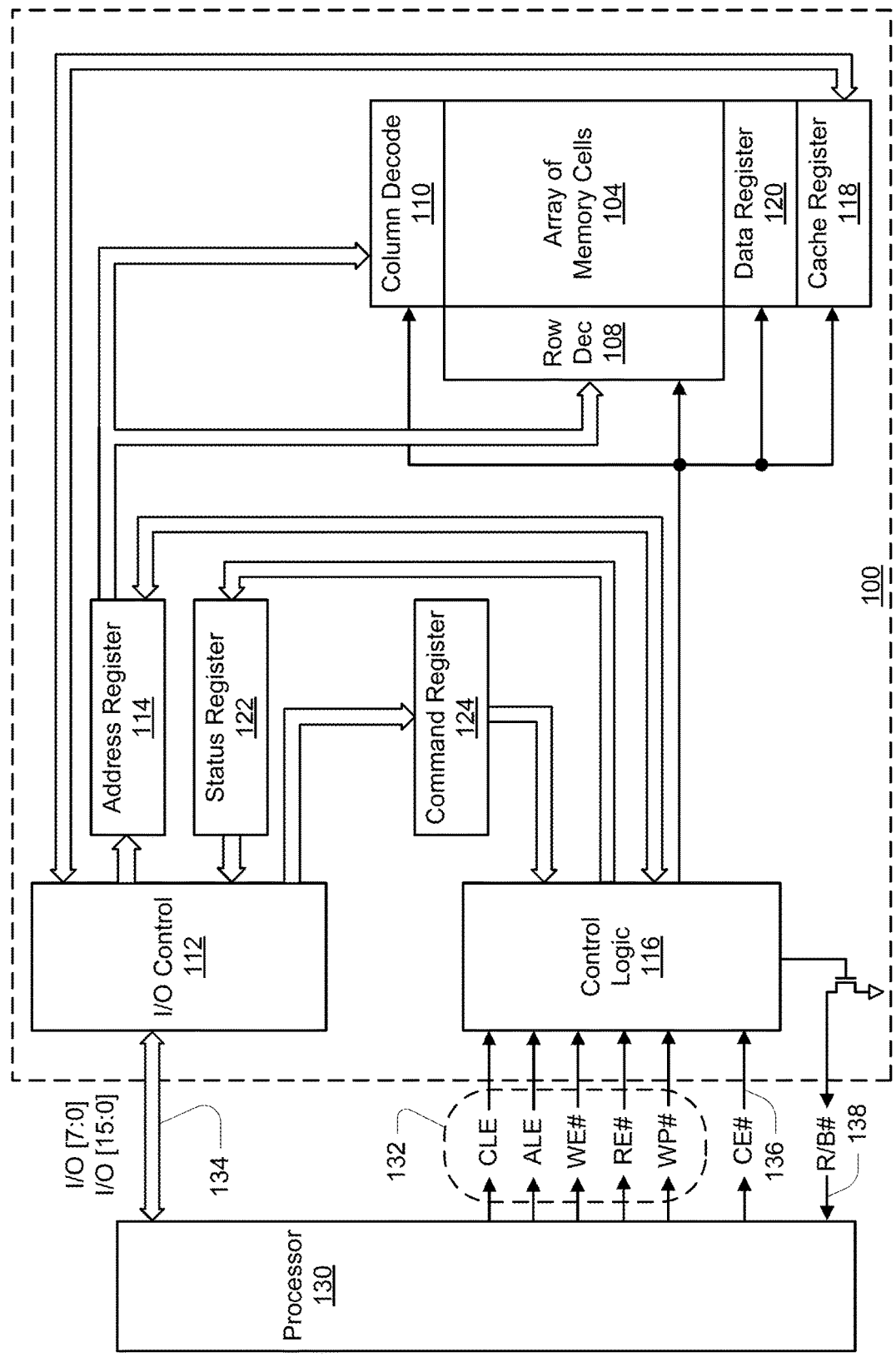
FIG. 1 is a simplified block diagram of a memory in communication with a processor as part of an electronic system, according to an embodiment.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., read operations, program operations and/or erase operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 may receive control signals at control logic 116 from processor 130 over a control link 132. The control signals might include a command latch enable CLE, an address latch enable ALE, a write enable WE#, a read enable RE#, and a write protect WP#. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134. Memory device 100 may further have a control signal line 136 to receive a chip enable CE# control signal at control logic 116 from processor 130. Memory device 100 may further have a signal line 138 to provide a ready/busy RB# control signal to the processor 130 responsive to the control logic 116. The ready/busy RB# control signal may be used to indicate to the processor 130 that the memory device 100 is busy performing an operation.

For example, the commands are received over input/output (I/O) pins [7:0] of I/O bus 134 at I/O control circuitry 112 and are written into command register 124. The addresses are received over input/output (I/O) pins [7:0] of I/O bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device. Although not depicted in FIG. 1, the control link 132 and the I/O bus 134 may be connected to the processor 130 through a multiplexer/demultiplexer according to embodiments.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
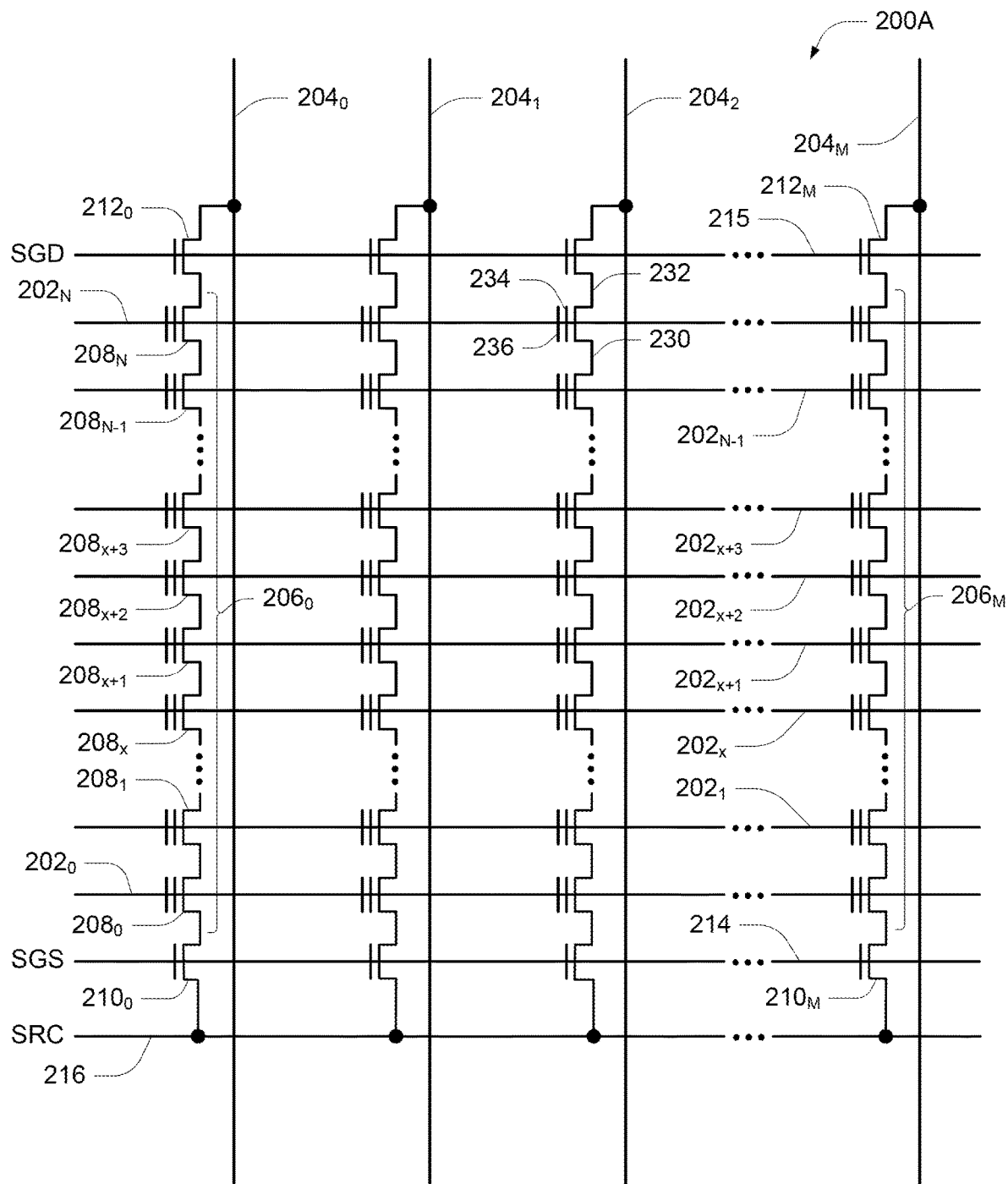
FIGS. 2A-2B are schematics of portions of an array of memory cells as could be used in a memory of the type described with reference to FIG. 1.

FIG. 2A is a schematic of a portion of an array of memory cells 200A as could be used in a memory of the type described with reference to FIG. 1, e.g., as a portion of array of memory cells 104. Memory array 200A includes access lines, such as word lines $202_0$ to $202_N$, and a data line, such as bit line 204. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line, and select gates $212_0$ to $212_M$ might be commonly connected to a select line 215, such as a drain select line. Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the common bit line 204. A control gate of each select gate 212 might be connected to select line 215.

The memory array in FIG. 2A might be a three-dimensional memory array, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Sensing the data state of a selected memory cell 208 of a NAND string 206 might include applying a number of stepped read voltages to a selected word line 202 while applying voltage levels to remaining word lines 202 coupled to the unselected memory cells 208 of the NAND 206 string sufficient to place the unselected memory cells in a conducting state independent of the Vt of the unselected memory cells. The bit line 204 corresponding to the selected memory cell 208 being read and/or verified may be sensed to determine whether or not the selected memory cell activates (e.g., conducts) in response to the particular read voltage level applied to the selected word line 202. For example, the data state of the selected memory cell 208, may be determined based on the current or voltage level of the bit line 204.

Figure 2B:
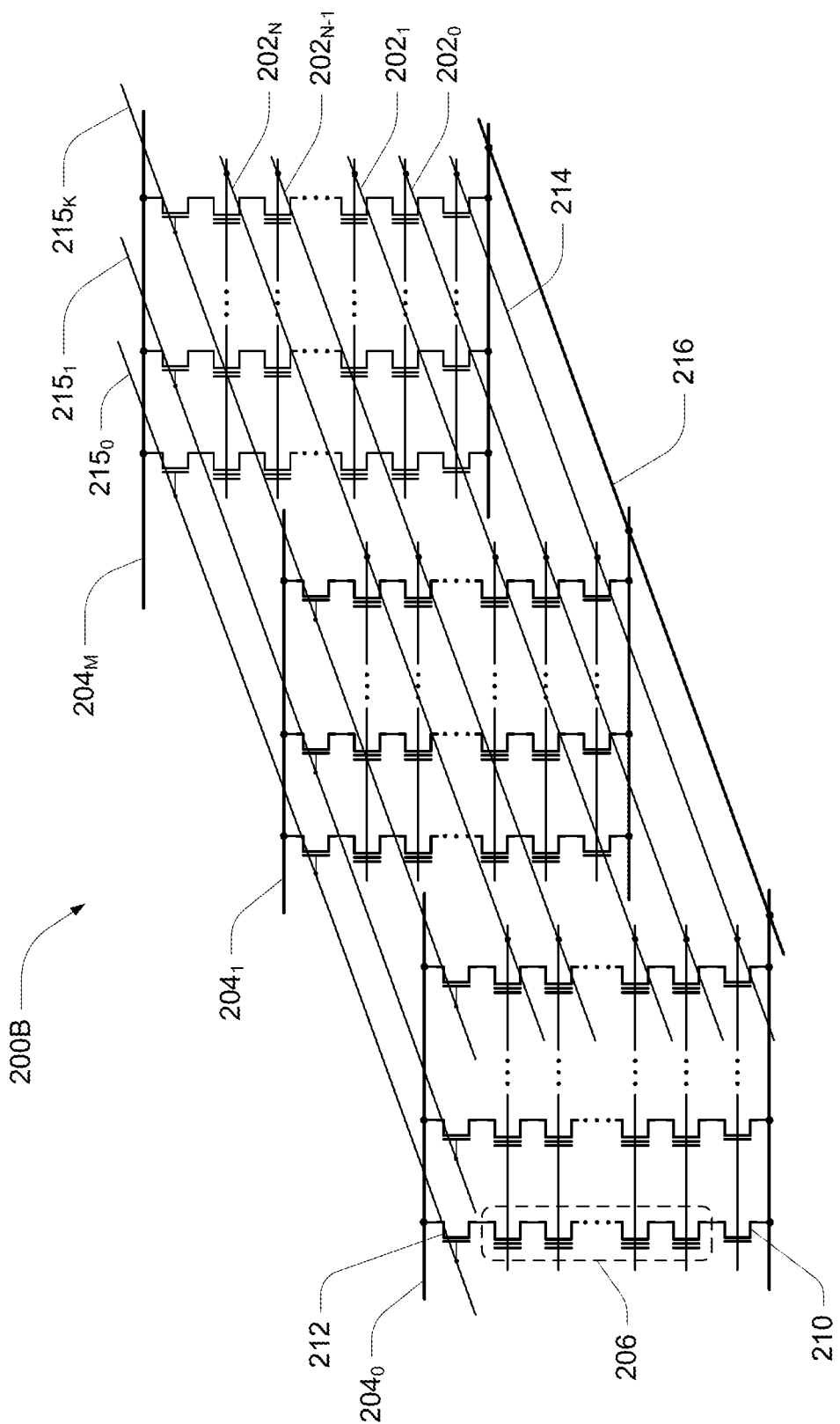

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 3A:
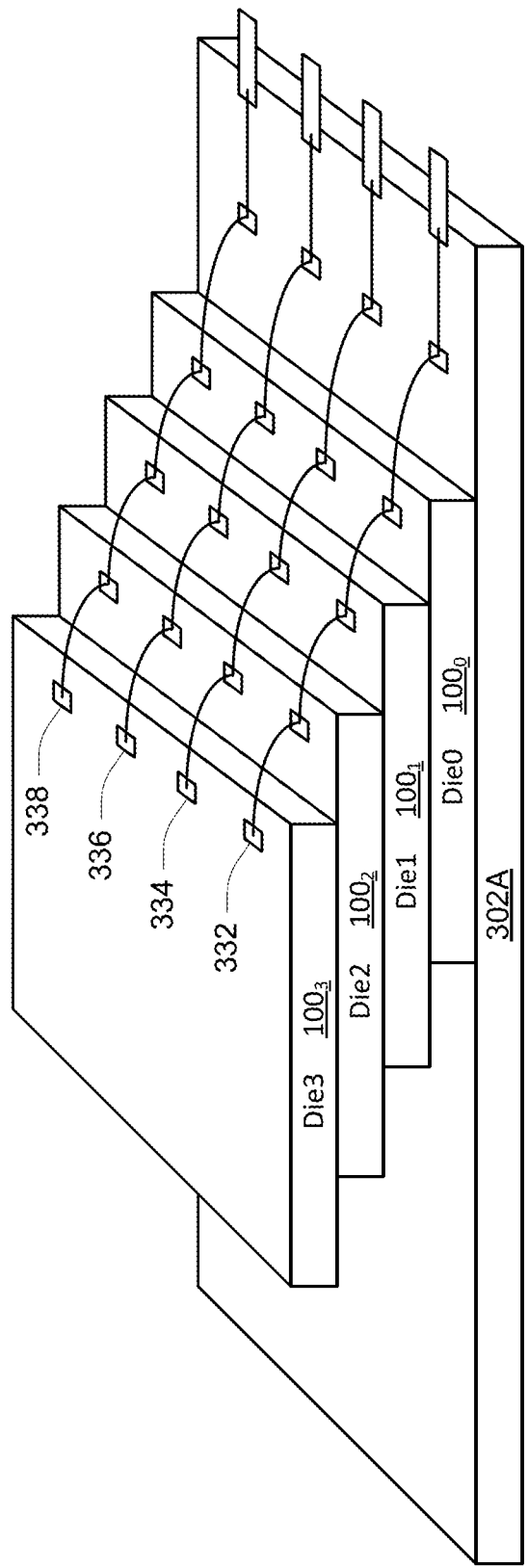
FIG. 3A is a perspective view of a representation of a memory package, such as a multi-die package, according to an embodiment.

FIG. 3A is a perspective view of a representation of a memory package, such as a multi-die package, 302A according to an embodiment. Multi-die package 302A is depicted to include four memory devices or memory dies 100 (i.e., $100_0$-$100_3$ corresponding to Die0-Die3), although multi-die packages could have fewer or more such memory dies. Each of the memory dies 100, as well as the multi-die package 302A, may include a node 332 for providing control signals. Note that each node 332 may represent more than one physical node, e.g., one pad for each control signal of a control link 132 of FIG. 1 for each of the memory dies 100 and the multi-die package 302A. The respective nodes 332 of different memory dies 100 may be commonly connected. Each of the memory dies 100, as well as the multi-die package 302A, may include a node 334 for providing input/output (I/O) signals. Note that each node 334 may represent more than one physical node, e.g., one pad for each signal of the I/O bus 134 of FIG. 1 for each of the memory dies 100 and the multi-die package 302A. The respective nodes 334 of different memory dies 100 may be commonly connected. Each of the memory dies 100, as well as the multi-die package 302A, may include a node 336 (e.g., a pad) for receiving a chip enable CE# control signal. The chip enable CE# control signal may be used to enable each of the individual memory dies 100 in the multi-die package 302A to receive commands and other parameters, e.g., over the I/O bus 134 of FIG. 1. The respective nodes 336 of different memory dies 100 may be commonly connected. Each of the memory dies 100, as well as the multi-die package 302A, may include a node 338 (e.g., a pad) for providing a ready/busy RB# control signal. The ready/busy RB# control signal may be used to indicate to a host device, or to the memory dies 100 in the multi-die package 302A, whether one or more of the memory dies 100 are busy performing an operation. The respective nodes 338 of different memory dies 100 may be commonly connected. Note further that additional connections may be incorporated into the multi-die package 302A. As one example, nodes (not shown) for connection to a reference resistance (e.g., a ZQ resistor) and a reference voltage (e.g., Vref) might be provided to facilitate calibration of termination devices of each of the memory dies 100 as is well understood in the art. Additional examples might include nodes (not shown) for various power supplies usable by the memory dies 100, e.g., Vss and Vcc, or other signals, such as data strobes, clock signals, etc.

Figure 3B:
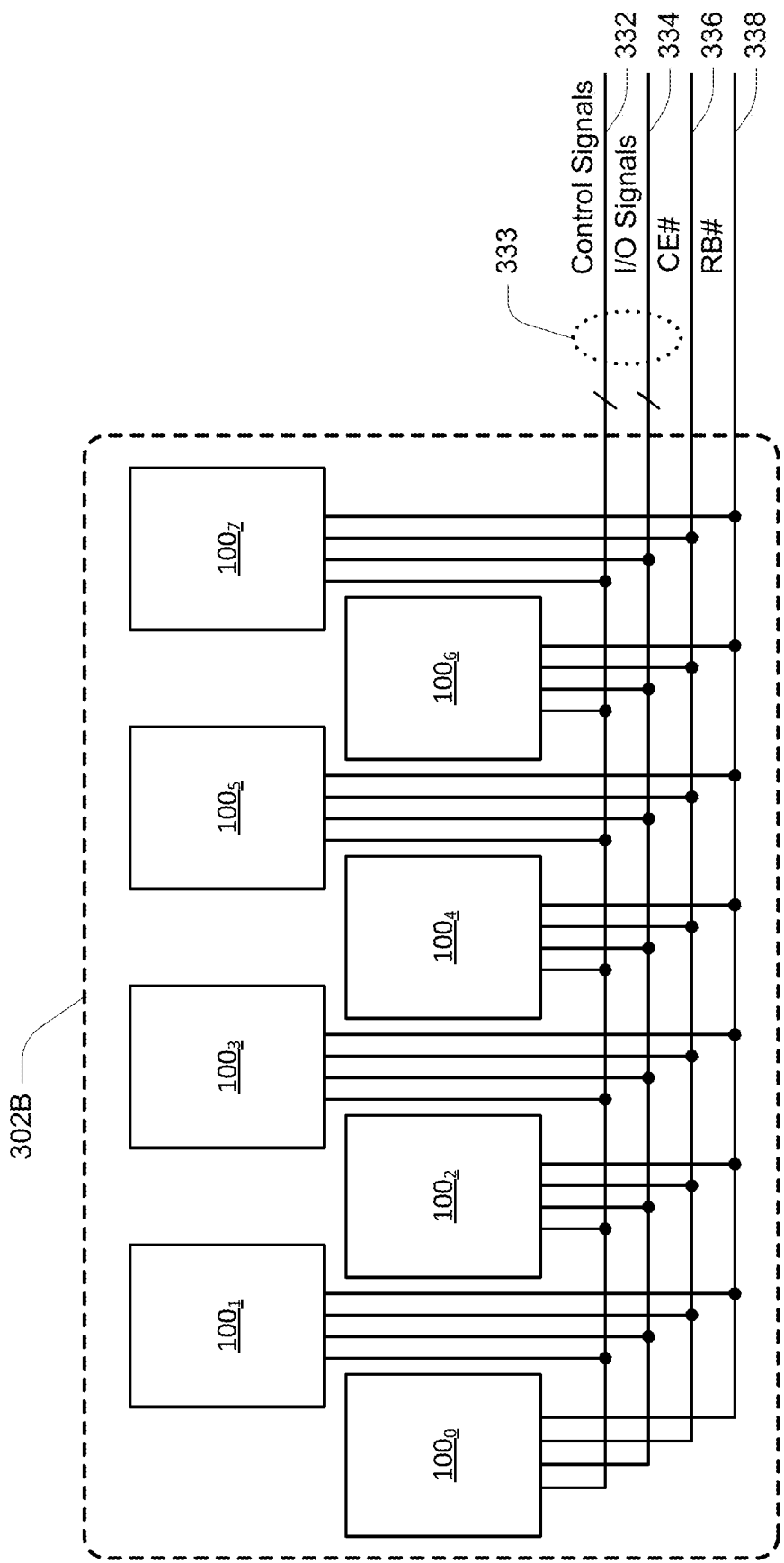
FIG. 3B is a schematic representation of memory package, such as a multi-die package, according to another embodiment.

FIG. 3B is a schematic representation of a memory package, such as a multi-die package, 302B including eight memory devices or dies 100 (e.g., $100_0$-$100_7$) according to an embodiment. Other numbers of memory dies in a multi-die package 302B may also be used in various embodiments. As depicted in FIG. 3B, each of the memory dies 100 of the multi-die package 302B may be commonly connected to the control signal nodes 332, commonly connected to the I/O signal nodes 334, commonly connected to the chip enable CE# control signal node 336, and commonly connected to the ready/busy RB# control signal node 338.

The control signal nodes 332 may be connected to signal lines of the control link 132 on a one-to-one basis for each of the memory dies 100. The I/O signal nodes 334 may be connected to signal lines of the I/O bus 134 on a one-to-one basis for each of the memory dies 100. The chip enable CE# control signal node 336 may be connected to the chip enable CE# control signal line 136 of each of the memory dies 100. The ready/busy RB# control signal node 338 may be connected to the ready/busy R/B# signal line 138 of each of the memory dies 100. The control signal nodes 332 and I/O signal nodes 334 may be collectively referred to as a set of memory device communication nodes 333.

Figure 4:
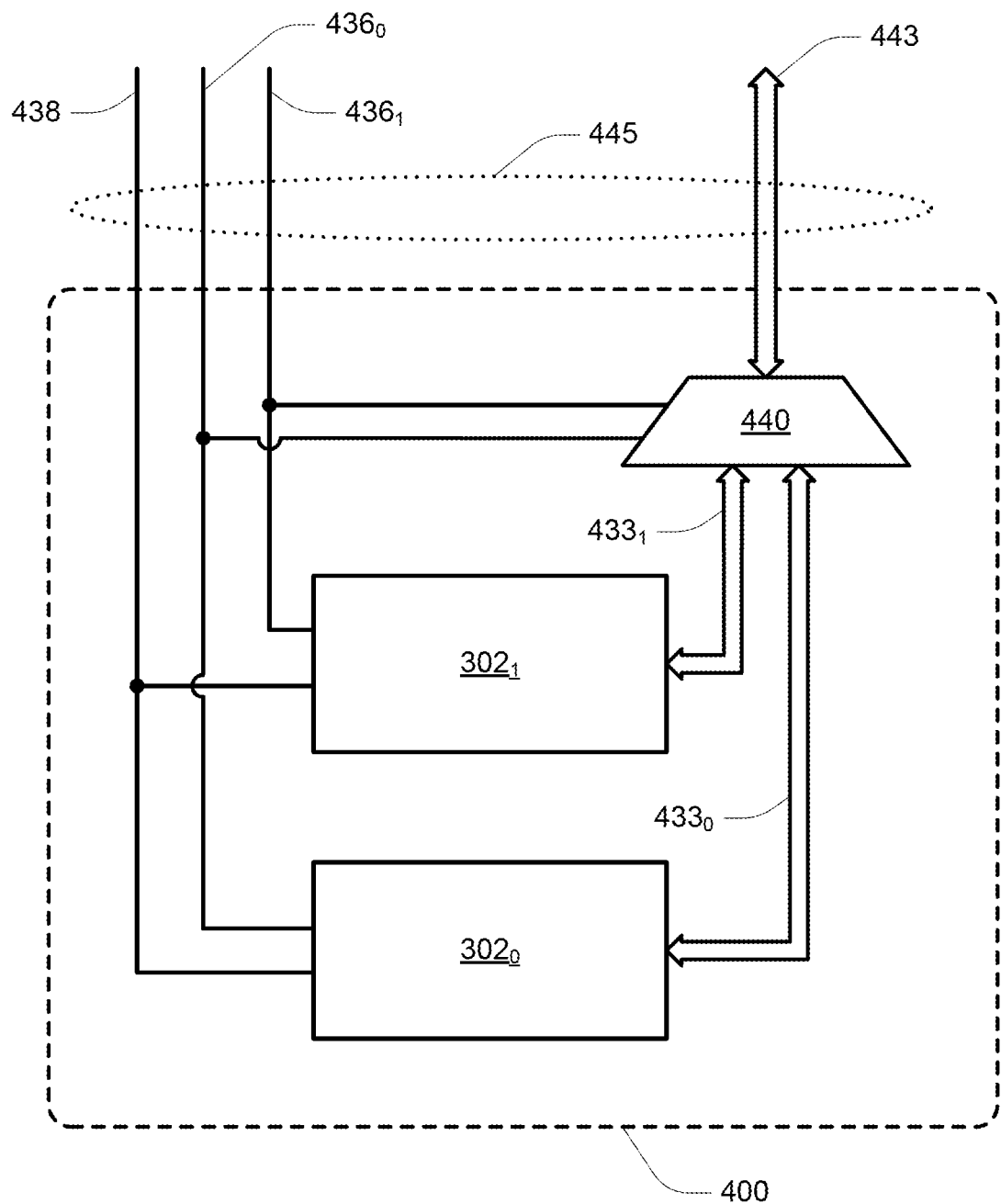
FIG. 4 is a schematic representation of a memory module according to an embodiment.

FIG. 4 is a schematic representation of a memory module 400 according to an embodiment. The memory module 400 of FIG. 4 is depicted to include two memory packages 302 (e.g., $302_0$ and $302_1$), such as multi-die packages 302A and/or 302B of FIGS. 3A-3B, for example. Other numbers of memory packages 302 in a memory module 400 may also be used in various embodiments. Although previously described as a multi-die package 302, such memory packages could represent any number of one or more memory devices connected to receive a single enable signal, such as the chip enable CE# control signal. A ready/busy signal line 438 may be commonly connected to the ready/busy R/B# signal nodes 338 of each of the memory packages 302 (e.g., memory packages $302_0$ and $302_1$). Chip enable CE# control signal lines 436 (e.g., signal lines $436_0$ and $436_1$) may be connected to the chip enable CE# control signal nodes 336 of respective memory packages 302 (e.g., memory packages $302_0$ and $302_1$, respectively) as well as to control inputs of a multiplexer/demultiplexer 440. As is common, the multiplexer/demultiplexer 440 will be referred to herein as simply a multiplexer 440.

The multiplexer 440 selectively connects a set of memory module communication signal lines 443 to a selected set of memory device communication signal lines 433. The set of memory module communication signal lines 443, the chip enable CE# control signal lines 436 (e.g., signal lines $436_0$ and $436_1$), and the ready/busy R/B# signal line 438 might form at least a portion of an interface 445 of the memory module 400 for communication with other apparatus.

For some operations on the memory packages 302, more than one set of memory device communication signal lines 433 might be selected concurrently. Each set of memory device communication signal lines 433 may be connected in a one-to-one relationship to a set of memory device communication nodes 333 of a respective memory package 302, e.g., a respective signal line of a set of memory device communication signal lines 433 connected to each of the control signal nodes 332 connected to a control link 132, and a respective signal line of that set of memory device communication signal lines 433 connected to each of the I/O signal nodes 334 connected to an I/O bus 134. Similarly, each signal line of a set of memory module communication signal lines 443 may be selectively connected in a one-to-one relationship to a respective signal line of a set of memory device communication signal lines 433, thereby facilitating connection to each of the control signal nodes 332 connected to a control link 132, and to each of the I/O signal nodes 334 connected to an I/O bus 134. The use of the multiplexer 440 facilitates isolation of a portion of the memory packages 302 from the set of memory module communication signal lines 443, which can limit the capacitance presented to the set of memory module communication signal lines 443 as the number of memory devices/memory dies 100 increases.

Although the multiplexer 440 provides bi-directional communication between the set of memory module communication signal lines 443 and one (or more) of the sets of memory device communication signal lines 433, the connection to the set of memory module communication signal lines 443 (e.g., on the side of the multiplexer 440 connected to the interface 445) will be referred to herein as an output of the multiplexer 440, and each connection to a set of memory device communication signal lines 433 (e.g., on the side of the multiplexer 440 connected to the memory packages 302) will be referred to herein as an input of the multiplexer 440.

Selection of one of the sets of memory device communication signal lines 433 by the multiplexer 440 may be responsive to the logic levels of the chip enable CE# control signal lines 436 applied to the multiplexer 440. For example, when the chip enable CE# control signal line $436_0$ has a first logic level, e.g., a logic low level, the set of memory device communication signal lines $433_0$ may be selected for connection to the set of memory module communication signal lines 443, and when the chip enable CE# control signal line $436_0$ has a second logic level, e.g., a logic high level, the set of memory device communication signal lines $433_0$ may be isolated from the set of memory module communication signal lines 443. Similarly, when the chip enable CE# control signal line $436_1$ has the first logic level, the set of memory device communication signal lines $433_1$ may be selected for connection to the set of memory module communication signal lines 443, and when the chip enable CE# control signal line $436_1$ has the second logic level, the set of memory device communication signal lines $433_1$ may be isolated from the set of memory module communication signal lines 443. For embodiments providing additional memory packages 302 in a memory module 400, e.g., N memory packages 302 where N is a positive integer value greater than two, an N:1 multiplexer might be provided with N chip enable CE# control signal lines 436 for selection of one of the N sets of memory device communication signal lines 433 for connection to the set of memory module communication signal lines 443 in a like manner.

Use of the multiplexer 440 as described facilitates the connection of only enabled memory devices to the interface 445 of the memory module 400, and, as subsequently described, to a memory channel communication link. This can facilitate mitigation of capacitance concerns compared to common configuration utilizing expander blocks to increase the number of memory devices that can be in communication with a memory channel communication link. In addition, a multiplexer 440 provides passive I/O expansion in that the multiplexer 440 is responsive to the same enable signals as the memory packages 302.

Use of the multiplexer 440 as described may result in space and/or power savings over prior art approaches to address the performance of systems containing higher numbers of memory devices. For example, the use of an expander block external to multiple memory modules might generally require switching of the memory channel communication link responsive to multiple address signals, and may detrimentally impact the available space on a printed circuit board (PCB) containing the memory modules and the expander block. Another prior art approach might include the use of an embedded retimer application-specific integrated circuit (ASIC) to improve signal integrity despite the increased bus loading concerns. Such devices permit the retiming and redriving of signals to improve overall signal integrity. However, such devices generally require active clocking elements, such as redrivers, retimers and phase-locked loops (PLLs), which consume significantly more power than a multiplexer.

Figure 5:
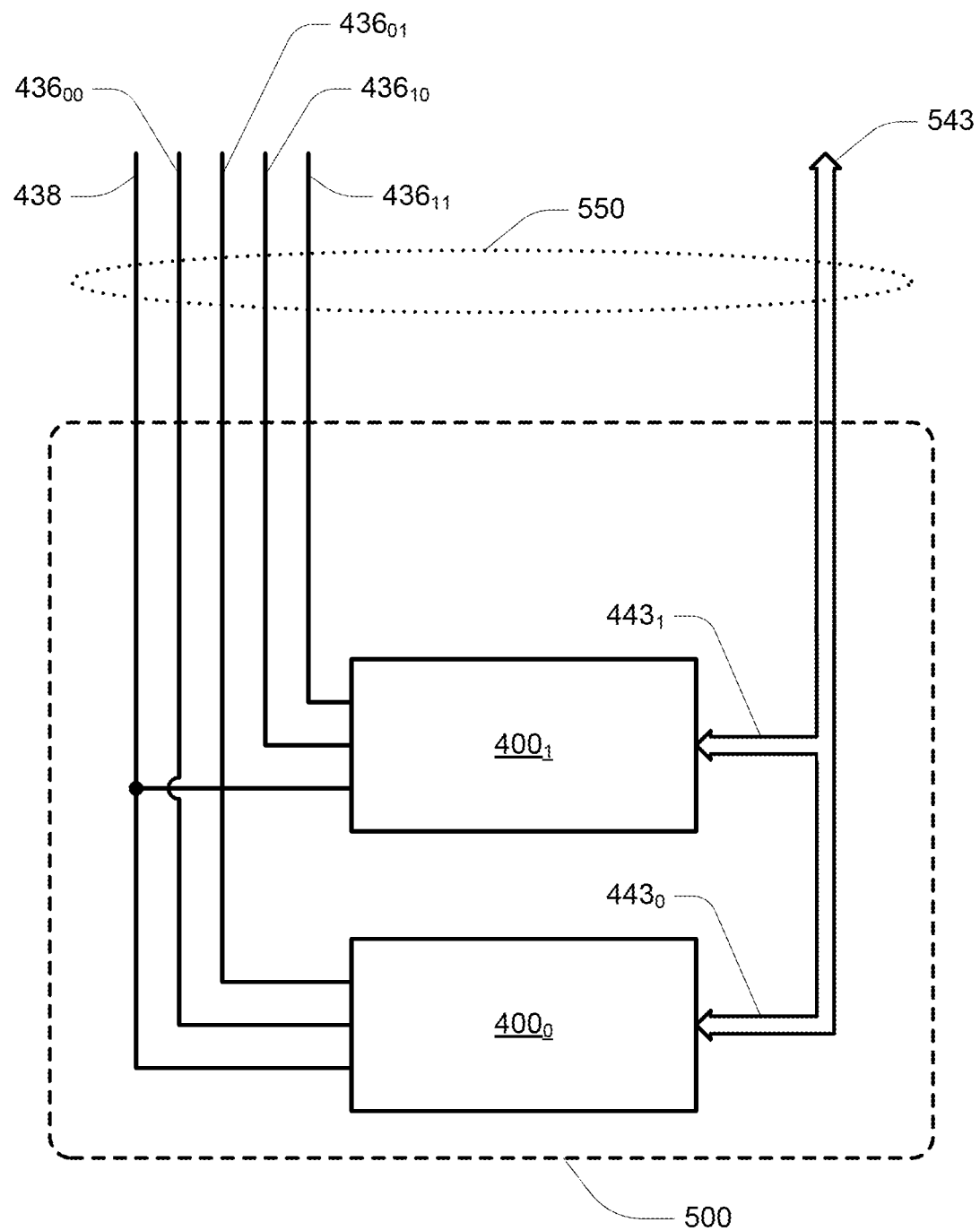
FIG. 5 is a schematic representation of a grouping of memory modules connected to a memory communication channel according to an embodiment.

FIG. 5 is a schematic representation of a grouping 500 of memory modules 400 connected to a memory communication channel 550 according to an embodiment. The grouping 500 of memory modules 400 of FIG. 4 is depicted to include two memory modules 400 (e.g., $400_0$ and $400_1$). Other numbers of memory modules 400 may also be used in various embodiments. As depicted in FIG. 5, each memory module 400 may be connected to a respective plurality of chip enable CE# control signal lines 436, e.g., one chip enable CE# control signal line 436 for each memory package 302 of that memory module 400. For example, as depicted in FIG. 5, memory module $400_0$ may be connected to two chip enable CE# control signal lines 436, e.g., chip enable CE# control signal line $436_{00}$ and chip enable CE# control signal line $436_{01}$, and memory module $400_1$ may be connected to two chip enable CE# control signal lines 436, e.g., chip enable CE# control signal line $436_{10}$ and chip enable CE# control signal line $436_{11}$. As further depicted in FIG. 5, each memory module 400 may be commonly connected to the ready/busy R/B# signal line 438. And as further depicted in FIG. 5, the set of memory module communication signal lines $443_0$ and $443_1$ of the memory modules $400_0$ and $400_1$ may be commonly connected as a common set of memory module communication signal lines 543. The set of memory module communication signal lines 543, the chip enable CE# control signal lines 436 and the ready/busy R/B# signal line 438 may be collectively referred to as a memory channel communication link 550.

Figure 6:
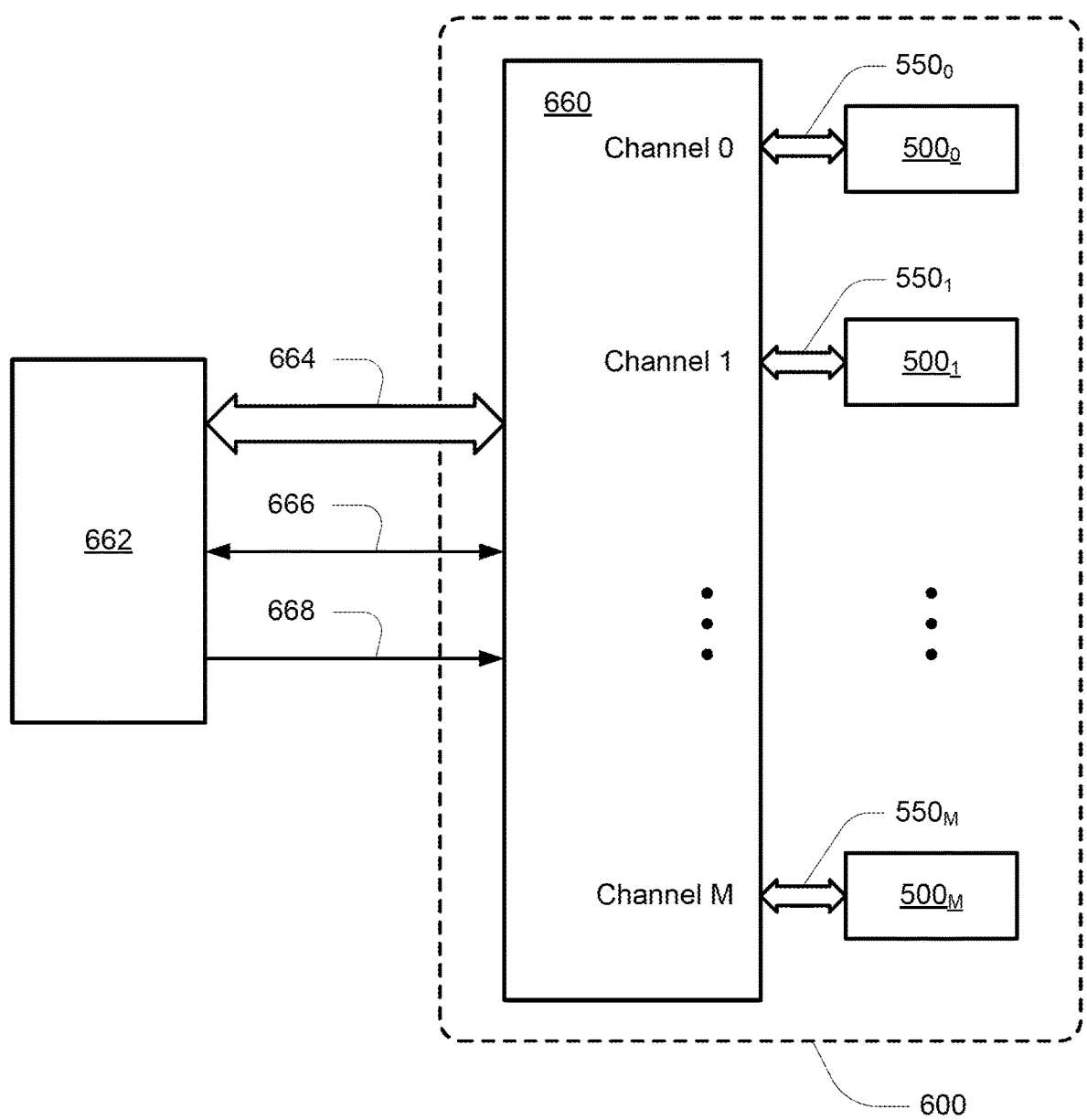
FIG. 6 is a schematic representation of a bulk storage device connected to a host device according to an embodiment.

FIG. 6 is a schematic representation of a bulk storage device 600 connected to a host device 662 according to an embodiment. For example, the bulk storage device 600 may be a solid state drive (SSD). The bulk storage device 600 may include a controller 660, e.g., a memory controller, having a number of channels (e.g., Channel 0 to Channel M). M is a positive integer value greater than or equal to 1. Each channel of the controller 660 may be connected to a respective memory channel communication link 550 (e.g., memory channel communication links $550_0$ to $550_M$, respectively) connected to a respective grouping 500 of memory modules (e.g., groupings $500_0$ to $500_M$, respectively).

The controller 660 is further in communication with a host device 662 as part of an electronic system. Because controller 660 is between the host device 662 and the groupings 500 of memory modules, communication between the host device 662 and the controller 660 may involve different communication links than those used between the controller 660 and the groupings 500 of memory modules. For example, a memory module of the groupings 500 of memory modules may be an Embedded MultiMediaCard (eMMC). In accordance with existing standards, communication with an eMMC may include a data link 664 for transfer of data (e.g., an 8-bit link), a command link 666 for transfer of commands and device initialization, and a clock link 668 providing a clock signal for synchronizing the transfers on the data link 664 and command link 666. The controller 660 may handle many activities autonomously, such as error correction, management of defective blocks, wear leveling and address translation.

Figure 7:
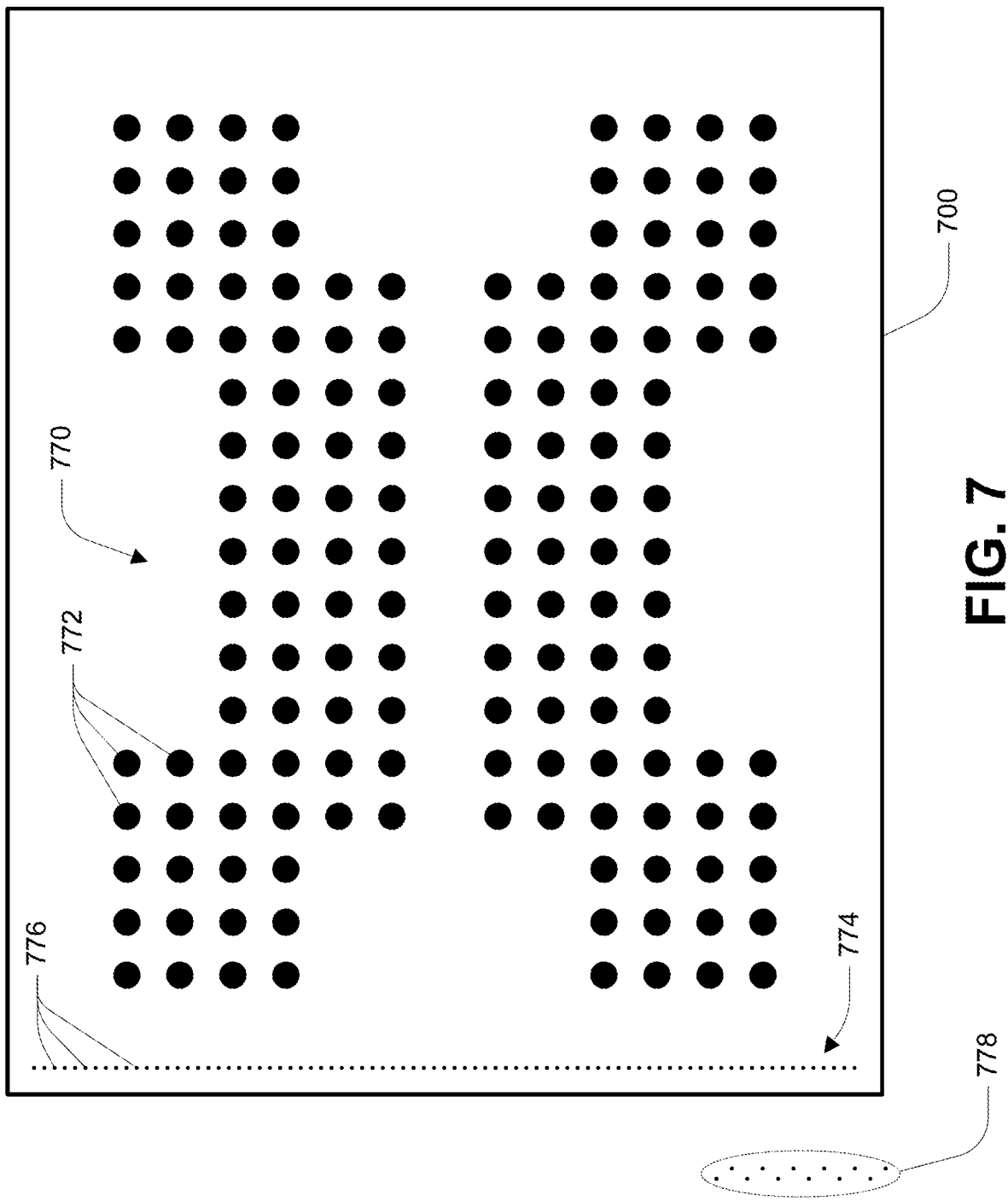
FIG. 7 is a planar view of a testable memory module in accordance with an embodiment.

FIG. 7 is a planar view of a testable memory module 700 in accordance with an embodiment. The testable memory module 700 might represent a packaged (e.g., encapsulated) memory module 400, including a plurality of memory packages 302 and a multiplexer 440 such as described with reference to FIG. 4 encased in an integrated circuit package. The testable memory module 700 includes an interface (e.g., an interface 445 of memory module 400 of FIG. 4) having a first set of contacts 770, including a number of individual contacts 772, and having a second set of contacts 774, including a number of individual contacts 776. Some contacts 772 of the first set of contacts 770 and/or some contacts 776 of the second set of contacts 774 may be unused, e.g., commonly referred to as NC or no contact. Individual relevant contacts 772 of the first set of contacts 770 might be connected to corresponding contacts 776 of the second set of contacts 774. For example, contacts 772 of the first set of contacts 770 corresponding to the set of memory module communication signal lines 443, the chip enable CE# control signal lines $436_0$ and $436_1$, and the ready/busy R/B# signal line 438 might be connected to corresponding contacts 776 of the second set of contacts 774.

The first set of contacts 770 might represent a land grid array (LGA). The LGA might represent a two-dimensional array of solder ball lands used in fabricating ball grid array (BGA) structures commonly used in the fabrication of packaged integrated circuit devices, but without the solder balls. For example, the first set of contacts 770 depicted in FIG. 7 might represent the pattern of a standard 152-contact BGA. The first set of contacts 770 might occupy a substantial (e.g., a majority) portion of a surface (e.g., a bottom surface) of the testable memory module 700. The first set of contacts 770 might be sized and/or arranged to facilitate testing of the testable memory module 700 by providing contacts 772 suitable for industry standard testing equipment, which might be used to identify defects, and/or to adjust trim values used during operation of its memory devices. In addition, lacking the solder balls of a typical BGA structure, the first set of contacts 770 might facilitate stacking of multiple testable memory modules 700, e.g., to fabricate a grouping 500 of memory modules 400 such as described with reference to FIG. 5.

The second set of contacts 774 might represent an array (e.g., a one-dimensional array or staggered array) of contacts 776 along an edge (e.g., a single edge) of the testable memory module 700. The contacts 776 of the second set of contacts 774 might be sized and/or arranged to facilitate attaching wiring to the testable memory module 700, such as bond fingers for wire lands. The pop-out 778 depicts an example of a staggered array of contacts as one example of an alternative arrangement to the one-dimensional array of contacts 776 depicted in FIG. 7 for the second set of contacts 774.

By shingling multiple testable memory modules, such as depicted with the memory dies 100 in FIG. 3A, contacts 776 of the second sets of contacts 774 of multiple testable memory modules 700 corresponding to the sets of memory module communication signal lines 443 of each of these testable memory modules 700 might be commonly connected to fabricate a grouping 500 of memory modules 400 suitable for connection to a memory channel communication line 550, for example. Because individual testable memory modules 700 can be tested prior to connecting its second set of contacts 774 to the second set of contacts 774 of any additional testable memory modules 700, yield of assembled groupings 500 of memory modules might be improved by prior elimination of testable memory modules 700 that are deemed to fail testing.

Figure 8:
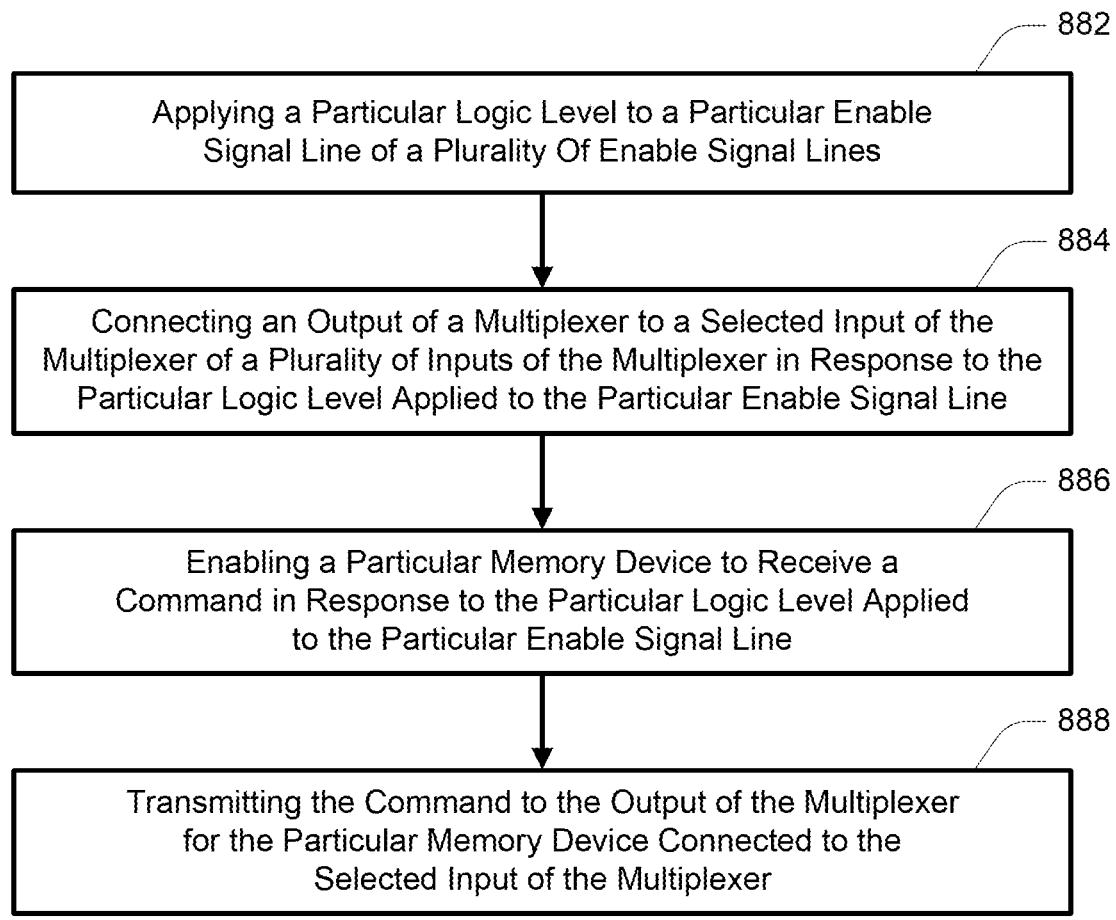
FIG. 8 is a flowchart of a method of operating an apparatus according to an embodiment.

FIG. 8 is a flowchart of a method of operating an apparatus, e.g., a bulk storage device, according to an embodiment. At 882, a particular logic level may be applied to a particular enable signal line, such as a chip enable CE# control signal line, of a plurality of enable signal lines, such as chip enable CE# control signal lines $436_{00}$, $436_{01}$, $436_{10}$, and $436_{11}$ of FIG. 5. For example, the controller 660 of FIG. 6 might apply the particular logic level, e.g., a logic low level, to a particular chip enable CE# control signal line $436_{00}$ of FIG. 5 through a corresponding signal line of the memory channel communication link 550. A second logic level, different than the particular logic level, might be applied (e.g., concurrently applied) to remaining enable signal lines. For example, the controller 660 of FIG. 6 might apply (e.g., concurrently apply) the second logic level, e.g., a logic high level, to remaining chip enable CE# control signal lines 436, e.g., chip enable CE# control signal lines $436_{01}$, $436_{10}$, and $436_{11}$, through corresponding signal lines of the memory channel communication link 550. Applying a particular logic level to a signal line is typically achieved by applying corresponding voltage levels to the signal line. For example, a logic low level is often achieved by applying a voltage level of a first supply voltage, e.g., Vss or ground, while a logic high level is often achieved by applying a voltage level of a second supply voltage, e.g., Vcc.

At 884, an output of a multiplexer is connected to a selected one of its inputs in response to the particular logic level being applied to the particular enable signal line. Continuing with the example, if the chip enable CE# control signal line $436_{00}$ of FIG. 5 corresponds to the chip enable CE# control signal line $436_0$ of FIG. 4, the multiplexer 440, in response to the logic level of the chip enable CE# control signal line $436_0$, might connect its output to the one of its inputs corresponding to the set of memory device communication signal lines $433_0$, and thus to the memory package $302_0$. In other words, the multiplexer 440 might connect the set of memory module communication signal lines 443 to the set of memory device communication signal lines $433_0$ in response to the logic level of the chip enable CE# control signal line $436_0$.

At 886, a particular memory device might be enabled to receive a command in response to the particular logic level applied to the particular enable signal line. For example, a memory device connected to the particular enable signal line having the particular logic level might be enabled to receive the command. This memory device might further be connected to the input of the multiplexer selected in response to the particular enable signal line having the particular logic level. Continuing with the example, if the memory module $400_0$ receiving the chip enable CE# control signal line $436_{00}$ of FIG. 5 corresponds to the memory module 400 of FIG. 4 and if the chip enable CE# control signal line $436_{00}$ of FIG. 5 corresponds to the chip enable CE# control signal line $436_0$ of FIG. 4, a memory device of the memory package $302_0$ (e.g., each memory device of the memory package $302_0$) might be enabled to receive the command. As noted previously, addressing associated with the command can be used to indicate to each memory device 100 of a memory package 302 whether it is selected to respond to the command when a memory package 302 includes more than one memory device 100. Accordingly, even though more than one memory device might be enabled to receive the command, response to the command, e.g., performing an access operation or other activity, might be limited to a single memory device or a subset of memory devices of the memory package.

At 888, the command might be transmitted to the output of the multiplexer for the memory device connected to the selected input of the multiplexer. Continuing with the example, the controller 660 of FIG. 6 might transmit an access command through the memory channel communication link 550, e.g., a read command, a write command, or an erase command, directed to a selected memory device (e.g., a memory die 100) of a memory package 302 of a memory module 400 of a grouping 500 of memory modules. The access command, and any associated address and data, might be transmitted using signal lines of the memory channel communication link 550 corresponding to nodes of the set of memory module communication signal lines 443 that correspond to nodes of the set of memory device communication signal lines 433 that correspond to the I/O bus 134 of the selected memory die 100. In this example, the memory dies 100 of the memory package 302$_0$ may each be enabled to receive commands in response to the chip enable CE# control signal line 436$_0$ having the particular logic level. The controller 660 might further transmit an address associated with the access command to indicate to which particular memory die 100 the access command is directed.

The command transmitted to the output of the multiplexer might be responsive to a host device. For example, the host device 662 might transmit a command to the controller 660 using the command link 666 indicating a desire to write data to a logical address location of the bulk storage device 600, and might further transmit the data, using the data link 664, to be written to that logical address. The controller 660 might then decode the received write command, and perform address translation on the logical address to determine a physical address of a memory device 100 to which data is to be written, thus determining the appropriate memory channel and memory channel communication link 550, and the corresponding grouping 500 of memory modules 400, memory module 400 and memory package 302 containing that memory die 100. Alternatively, the command might be generated by the controller 660 autonomously. For example, the controller 660 may determine a desire to perform wear leveling, and may issue corresponding commands to read data from an original location, write data to a different location, and erase the original location.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. An apparatus, comprising:
    a first set of memory devices commonly connected to receive a first enable signal;
    a second set of memory devices commonly connected to receive a second enable signal; and
    a multiplexer connected to receive the first enable signal and the second enable signal;
    wherein the multiplexer is configured to connect input/output signal lines of the first set of memory devices to an interface of the apparatus in response to the first enable signal having a first logic level, and to isolate the input/output signal lines of the first set of memory devices from the interface of the apparatus in response to the first enable signal having a second logic level different than the first logic level; and
    wherein the multiplexer is further configured to connect input/output signal lines of the second set of memory devices to the interface of the apparatus in response to the second enable signal having the first logic level, and to isolate the input/output signal lines of the second set of memory devices from the interface of the apparatus in response to the second enable signal having the second logic level.

2. The apparatus of claim 1, further comprising:
    a first set of memory device communication signal lines connected to corresponding nodes of each memory device of the first set of memory devices; and
    a second set of memory device communication signal lines connected to corresponding nodes of each memory device of the second set of memory devices;
    wherein the interface of the apparatus comprises a set of memory module communication signal lines;
    wherein the multiplexer is further configured to connect each signal line of the first set of memory device communication signal lines to a respective signal line of the set of memory module communication signal lines in response to the first enable signal having the first logic level, and to isolate each signal line of the first set of memory device communication signal lines from its respective signal line of the set of memory module communication signal lines in response to the first enable signal having the second logic level; and
    wherein the multiplexer is further configured to connect each signal line of the second set of memory device communication signal lines to a respective signal line of the set of memory module communication signal lines in response to the second enable signal having the first logic level, and to isolate each signal line of the second set of memory device communication signal lines from its respective signal line of the set of memory module communication signal lines in response to the second enable signal having the second logic level.

3. The apparatus of claim 1, wherein the first set of memory devices comprises N memory devices, wherein N is a positive integer value greater than or equal to one.

4. The apparatus of claim 3, wherein the second set of memory devices comprises a same number of memory devices as the first set of memory devices.

5. The apparatus of claim 1, further comprising:
    N additional sets of memory devices, each connected to receive a respective enable signal, wherein N is a positive integer value greater than or equal to one;
    wherein, for each additional set of memory devices, the multiplexer is further configured to connect input/output signal lines of that set of memory devices to the interface of the apparatus in response to its respective enable signal having the first logic level, and to isolate the input/output signal lines of that set of memory devices from the interface of the apparatus in response to its respective enable signal having the second logic level.

6. The apparatus of claim 1, wherein the interface of the apparatus is connected to a memory channel communication link of a bulk storage device.

7. The apparatus of claim 1, further comprising:
    a first set of contacts of the interface; and a second set of contacts of the interface;
wherein contacts of the first set of contacts are selectively connected to the input/output signal lines of the first set of memory devices and selectively connected to the input/output signal lines of the second set of memory devices;
wherein contacts of the second set of contacts are connected to corresponding contacts of the first set of contacts that are selectively connected to the input/output signal lines of the first set of memory devices and selectively connected to the input/output signal lines of the second set of memory devices.

8. The apparatus of claim 7, wherein the second set of contacts are arranged along one edge of an integrated circuit package encasing the apparatus.

9. The apparatus of claim 8, wherein the first set of contacts are arranged in a multi-dimensional array extending across a majority of a surface of the integrated circuit package containing the second set of contacts.

10. An apparatus, comprising:
a plurality of enable signal lines;
a plurality of sets of memory device communication signal lines;
a set of memory module communication signal lines;
a controller connected to each enable signal line of the plurality of enable signal lines and connected to the set of memory module communication signal lines;
a plurality of memory packages, each memory package of the plurality of memory packages comprising a respective set of memory devices commonly connected to a respective enable signal line of the plurality of enable signal lines, and commonly connected to a respective set of memory device communication signal lines of the plurality of sets of memory device communication signal lines; and
a multiplexer connected to each enable signal line of the plurality of enable signal lines, connected to each set of memory device communication signal lines of the plurality of sets of memory device communication signal lines, and connected to the set of memory module communication signal lines;
wherein the controller is configured to apply a particular logic level to the respective enable signal line of a particular memory package of the plurality of memory packages containing a memory device selected to receive a command, wherein the particular logic level is configured to enable each memory device of the respective set of memory devices of the particular memory package to receive the command; and
wherein the multiplexer is configured to connect the respective set of memory device communication signal lines of the particular memory package to the set of memory module communication signal lines in response to the controller applying the particular logic level to the respective enable signal line of the particular memory package.

11. The apparatus of claim 10, wherein the plurality of enable signal lines is a first plurality of enable signal lines, wherein the plurality of sets of memory device communication signal lines is a first plurality of sets of memory device communication signal lines, wherein the plurality of memory packages is a first plurality of memory packages, and wherein the multiplexer is a first multiplexer, the apparatus further comprising:
a second plurality of enable signal lines;
a second plurality of sets of memory device communication signal lines;
a second plurality of memory packages, each memory package of the second plurality of memory packages comprising a respective set of memory devices commonly connected to a respective enable signal line of the second plurality of enable signal lines, and commonly connected to a respective set of memory device communication signal lines of the second plurality of sets of memory device communication signal lines; and
a second multiplexer connected to each enable signal line of the second plurality of enable signal lines, connected to each set of memory device communication signal lines of the second plurality of sets of memory device communication signal lines, and connected to the set of memory module communication signal lines;
wherein the controller is further configured to apply a particular logic level to the respective enable signal line of a particular memory package of a particular plurality of memory packages, selected from a group consisting of the first plurality of memory packages and the second plurality of memory packages, containing a memory device selected to receive a command, wherein the particular logic level is configured to enable each memory device of the respective set of memory devices of the particular memory package to receive the command; and
wherein a particular multiplexer, selected from a group consisting of the first multiplexer and the second multiplexer, is configured to connect the respective set of memory device communication signal lines of the particular memory package to the set of memory module communication signal lines in response to the controller applying the particular logic level to the respective enable signal line of the particular memory package when the particular multiplexer is connected to the respective enable signal line of the particular memory package.

12. The apparatus of claim 11, further comprising:
a memory channel communication link connecting the first plurality of enable signal lines, the second plurality of enable signal lines, and the set of memory module communication signal lines to the controller.

13. The apparatus of claim 12, wherein the memory channel communication link is a first memory channel communication link, the apparatus further comprising:
a second memory channel communication link connecting additional pluralities of enable signal lines and an additional set of memory module communication signal lines to the controller.

14. The apparatus of claim 13, wherein the additional set of memory module communication signal lines is further connected to a third multiplexer.

15. The apparatus of claim 14, wherein the third multiplexer is further connected to a third plurality of sets of memory device communication signal lines, and wherein each set of memory device communication signal lines of the third plurality of sets of memory device communication signal lines is connected to each memory package of a third plurality of memory packages.

16. The apparatus of claim 15, further comprising:
a third plurality of enable signal lines, wherein each enable signal line of the third plurality of enable signal lines is connected to a respective memory package of the third plurality of memory packages;
wherein each memory package of the third plurality of memory packages comprises a respective set of memory devices;

wherein the controller is further configured to apply the particular logic level to a respective enable signal line of a second particular memory package of the third plurality of memory packages containing a memory device selected to receive a second command, wherein the particular logic level is configured to enable each memory device of the respective set of memory devices of the particular memory package to receive the second command; and wherein the third multiplexer is configured to connect the respective set of memory device communication signal lines of the second particular memory package to the set of memory module communication signal lines in response to the controller applying the particular logic level to the respective enable signal line of the second particular memory package.

17. The apparatus of claim 10, wherein for each memory package of the plurality of memory packages, its respective set of memory devices comprises one or more memory devices.

18. The apparatus of claim 17, wherein for each memory package of the plurality of memory packages, the one or more memory devices of its respective set of memory devices each correspond to a separate semiconductor die.

19. The apparatus of claim 10, wherein the controller is further configured to apply the particular logic level to more than one enable signal line of the plurality of enable signal lines concurrently if more than one memory package of the plurality of memory packages contains a memory device selected to receive the command.

20. A method of operating an apparatus, comprising:
applying a particular logic level to a particular enable signal line of a plurality of enable signal lines;
connecting an output of a multiplexer to a selected input of a plurality of inputs of the multiplexer in response to the particular logic level applied to the particular enable signal line;
enabling a particular memory device to receive a command in response to the particular logic level applied to the particular enable signal line, wherein the particular memory device is connected to the selected input of the multiplexer; and
transmitting the command to the output of the multiplexer for the particular memory device.

21. The method of claim 20, further comprising:
enabling at least one additional memory device to receive the command in response to the particular logic level applied to the particular enable signal line, wherein each at least one additional memory device is connected to the selected input of the multiplexer.

22. The method of claim 20, further comprising:
applying a second logic level, different than the particular logic level, to a different enable signal line of the plurality of enable signal lines while applying the particular logic level to the particular enable signal line;
isolating the output of the multiplexer from a different input of the plurality of inputs of the multiplexer in response to the second logic level applied to the different enable signal line; and
disabling a different memory device from receiving the command in response to the second logic level applied to the different enable signal line, wherein the different memory device is connected to the different input of the multiplexer.

* * * * *